United States Patent
Okano (10) Patent No.: US 9,431,307 B2
(45) Date of Patent: Aug. 30, 2016

(54) SEMICONDUCTOR WAFER EVALUATION METHOD, SEMICONDUCTOR WAFER EVALUATION DEVICE, AND PROBE FOR SEMICONDUCTOR EVALUATION DEVICE

(71) Applicant: SHOWA DENKO K.K., Minato-ku, Tokyo (JP)

(72) Inventor: Taichi Okano, Chichibu (JP)

(73) Assignee: SHOWA DENKO K.K., Tokyo (JP)

( * ) Notice: Subject to any disclaimer, the term of this patent is extended or adjusted under 35 U.S.C. 154(b) by 0 days.

(21) Appl. No.: 13/936,573

(22) Filed: Jul. 8, 2013

(65) Prior Publication Data

US 2014/0017826 A1    Jan. 16, 2014

(30) Foreign Application Priority Data

Jul. 10, 2012   (JP) .................. 2012-154703

(51) Int. Cl.
| | | |
|---|---|---|
| H01L 21/00 | (2006.01) | |
| H01L 21/66 | (2006.01) | |
| G01R 1/067 | (2006.01) | |
| G01R 31/26 | (2014.01) | |

(52) U.S. Cl.
CPC ............... *H01L 22/10* (2013.01); *G01R 1/067* (2013.01); *G01R 1/06783* (2013.01); *H01L 22/14* (2013.01); *H01L 22/30* (2013.01); *G01R 31/2648* (2013.01); *H01L 2924/0002* (2013.01)

(58) Field of Classification Search
CPC ....... H01L 22/10; H01L 22/30; H01L 22/14; H01L 2924/0002; H01L 2924/00; H01L 21/66; G01R 1/067; G01R 1/06783; G01R 31/2648
See application file for complete search history.

(56) References Cited

U.S. PATENT DOCUMENTS

| | | | | |
|---|---|---|---|---|
| 3,803,489 A | * | 4/1974 | Miller ................ | G01R 31/2637 324/754.04 |
| 5,023,561 A | * | 6/1991 | Hillard ........................ | 324/719 |
| 5,481,527 A | * | 1/1996 | Kasanuki et al. ........... | 369/126 |
| 6,144,039 A | | 11/2000 | Hshieh | |

(Continued)

FOREIGN PATENT DOCUMENTS

| | | |
|---|---|---|
| JP | 56-33849 A | 4/1981 |
| JP | 6-140478 A | 5/1994 |

(Continued)

OTHER PUBLICATIONS

Communication dated Mar. 1, 2016, from the Japanese Patent Office in counterpart application No. 2012-154703.

*Primary Examiner* — Charles Garber
*Assistant Examiner* — Abdulfattah Mustapha
(74) *Attorney, Agent, or Firm* — Sughrue Mion, PLLC (57) ABSTRACT

Provided is a semiconductor wafer evaluation method of performing an evaluation of electrical characteristics of a semiconductor wafer by bringing mercury into contact with a surface of the semiconductor wafer, the method including using a probe constituted of a fixed electrode having a tip end portion and a transparent covering portion that covers a portion other than the tip end portion of the fixed electrode, the fixed electrode being made of a metal having stronger wettability with respect to the mercury than the semiconductor wafer and the covering portion, and measuring the electrical characteristics by attaching the mercury to the tip end portion of the fixed electrode and then bringing the mercury into contact with the surface of the semiconductor wafer.

12 Claims, 6 Drawing Sheets

(56) References Cited

U.S. PATENT DOCUMENTS

| | | | | |
|---|---|---|---|---|
| 6,166,354 | A * | 12/2000 | Hause et al. | 219/390 |
| 7,642,772 | B1 * | 1/2010 | Faifer et al. | 324/754.23 |
| 2006/0066323 | A1 * | 3/2006 | Howland et al. | 324/750 |
| 2009/0072853 | A1 * | 3/2009 | Uchida et al. | 324/765 |
| 2010/0111788 | A1 * | 5/2010 | Kita et al. | 423/210 |

FOREIGN PATENT DOCUMENTS

| | | |
|---|---|---|
| JP | 2002-350480 A | 12/2002 |
| JP | 2010-153611 A | 7/2010 |

* cited by examiner

SEMICONDUCTOR WAFER EVALUATION METHOD, SEMICONDUCTOR WAFER EVALUATION DEVICE, AND PROBE FOR SEMICONDUCTOR EVALUATION DEVICE

BACKGROUND OF THE INVENTION

1. Field of the Invention

The present invention relates to a semiconductor wafer evaluation method, a semiconductor wafer evaluation device, and a probe for a semiconductor evaluation device.

Priority is claimed on Japanese Patent Application, No. 2012-154703, filed on Jul. 10, 2012, the contents of which are incorporated herein by reference.

2. Description of Related Art

As a method of measuring characteristics of carrier density of a semiconductor wafer and the like such as an epitaxial wafer that forms an epitaxial layer on a wafer of a silicon wafer, SiC wafer and so forth, a mercury probe method using mercury for an electrode is known. This method is called "Hg-CV method" in the present invention.

Hg-CV method is a type of capacity-voltage methods. The method, first, forms a Schottky junction by contacting a tip end of the mercury probe on a surface of the semiconductor wafer. In a case where an object to be measured is an epitaxial wafer, the "surface of the semiconductor wafer" refers to the surface of the epitaxial layer. In addition, the mercury probe is obtained by injecting mercury in a capillary (holder for holding the mercury) tube made of glass or the like. Next, capacitance (C)-reverse voltage (V) characteristics are measured across the Schottky junction formed on the surface of the semiconductor wafer, and donor density and the like are calculated from measurement result of the C-V characteristics. In a case where an oxide film is formed on the surface of the semiconductor wafer (considered as a structure of metal-oxide film-semiconductor (MOS structure)), MOS-CV measurement is performed. The C-V characteristics can also be measured in the MOS structure, a merit of the Hg-CV method is that a pre-treatment (formation of an oxide film, formation of an electrode and the like) is not necessary. In a case where the Schottky junction with the Hg is not formed, the MOS structure is made. In other words, there is a case where the C-V characteristics is measured by forming the oxide film on the surface of the semiconductor wafer using the Hg electrode.

As a device using the Hg-CV method, a semiconductor evaluation device is known which performs evaluation of electrical characteristics by bringing the mercury probe supported in a state of being freely movable in a direction perpendicular to the surface of the semiconductor wafer into contact with the surface of the semiconductor wafer (for example, refer to Japanese Unexamined Patent Application, First Publication No. 2010-153611). In addition, a measurement device of the semiconductor wafer is disclosed in which the mercury probe is held by a probe arm and the probe arm having mapping capability is horizontally-movable and rotationally-movable (for example, refer to Japanese Unexamined Patent Application, First Publication No. H06-140478). Further, an low-melting-point pad for an electrical connector is disclosed in which an n-type or p-type conductivity type semiconductor and a contact pad are sequentially laminated on a low-melting-point adhesive layer and a wire is connected to the contact pad thereof (for example, refer to U.S. Pat. No. 6,144,039).

Figure 7:
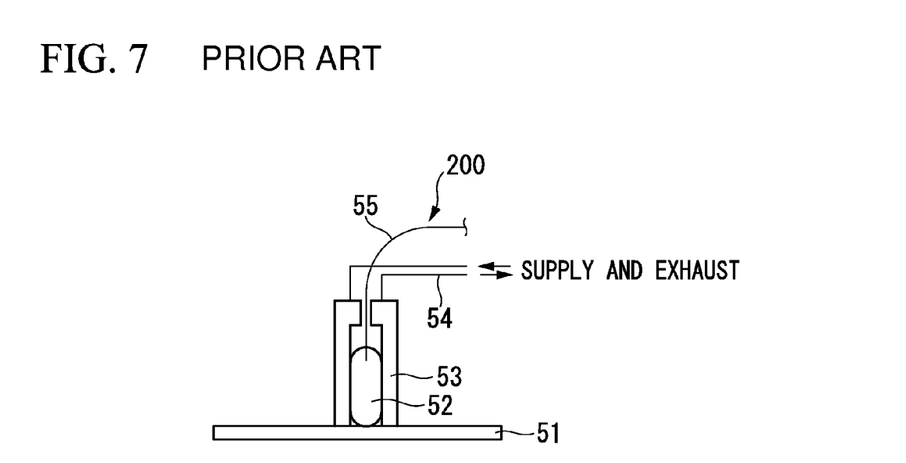
FIG. 7 is a schematic diagram showing a semiconductor wafer evaluation method of the related art.

FIG. 7 illustrates a configuration of the semiconductor wafer evaluation device in the related art. A semiconductor wafer evaluation device 200 includes mercury 52, a capillary 53 accommodating the mercury 52, a supply and exhaust pipe 54 that supplies and exhausts the interior of the capillary 53, a wire 55 that is electrically connected to the mercury 52, and an electrical characteristic measurement unit (not shown) that is electrically connected to the wire 55 and a semiconductor wafer 51 to be measured, and measures the electrical characteristics of the semiconductor wafer 51 by applying an electrical stimulation to the semiconductor wafer 51.

Figure 8:
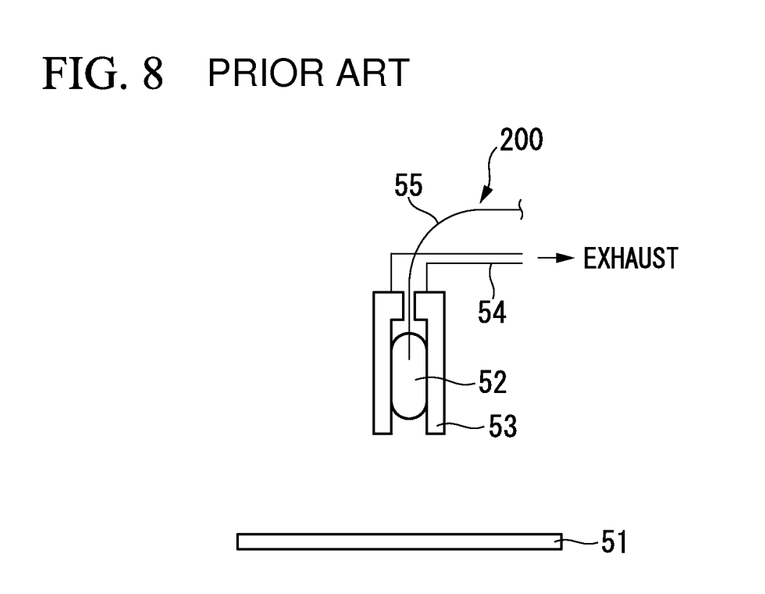
FIG. 8 is a schematic diagram showing a semiconductor wafer evaluation method of the related art.
Figure 9:
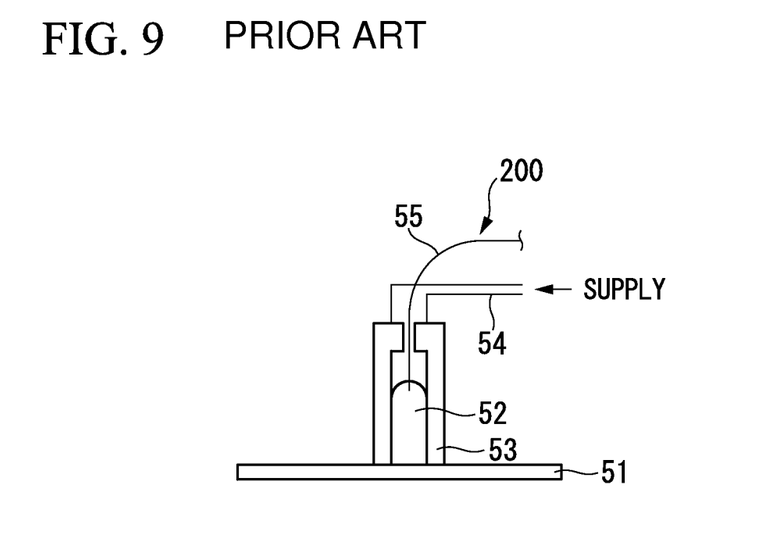
FIG. 9 is a schematic diagram showing a semiconductor wafer evaluation method in the related art.

When measuring the electrical characteristics of carrier density of the semiconductor wafer using the semiconductor wafer evaluation device 200, as illustrated in FIG. 8, first, the interior of the capillary 53 is exhausted through the supply and exhaust pipe 54 and then the capillary 53 is lifted in a state where the mercury 52 is held in the air of the capillary 53. Next, as illustrated in FIG. 9, the capillary 53 is lowered, air is supplied to the interior of the capillary 53, and the mercury 52 is lowered so that a bottom end of the mercury 52 is in contact with the semiconductor wafer 51. Then, an electrical signal is transmitted via the wire 55 connected to the mercury 52, and the response is retrieved from the wire 55. When parameters and the response of the electrical signal are retrieved, the electrical characteristics of the semiconductor wafer 51 are obtained.

In the above-described Hg-CV method, an area of the mercury electrode brought in to contact with the surface of the semiconductor wafer (mercury electrode area) has an effect on the calculation of the electrical characteristics. For this reason, in the Hg-CV method, it is important to accurately obtain an area of the mercury electrode. In a case of using the mercury probe in which the mercury is injected into the interior of a tube of the capillary (holder for holding the mercury) made of glass or the like, the area of the mercury electrode is a cross-sectional area of the capillary.

SUMMARY OF THE INVENTION

Figure 10:
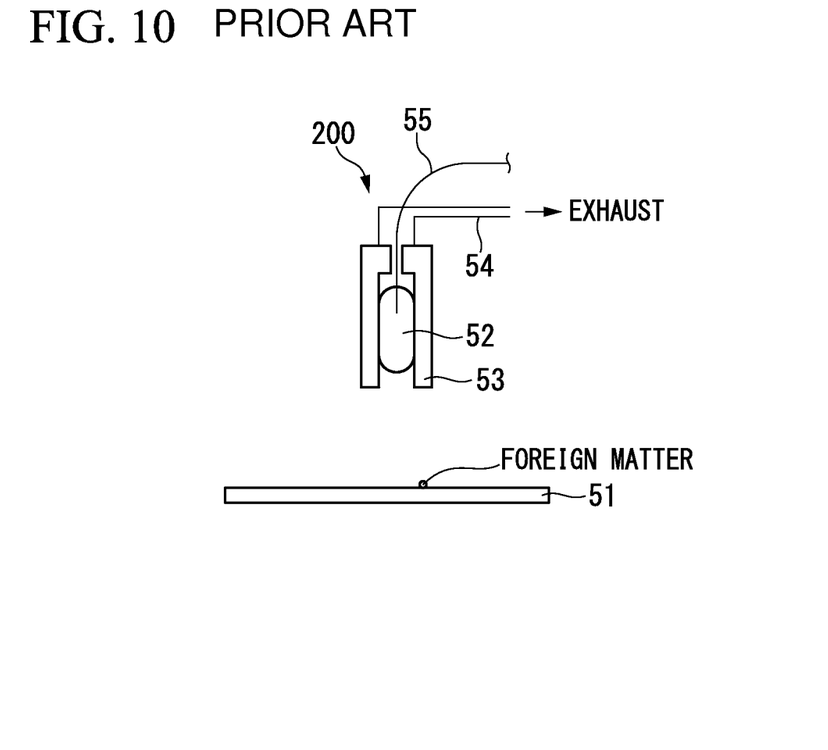
FIG. 10 is a schematic diagram showing a semiconductor wafer evaluation method of the related art.
Figure 11:
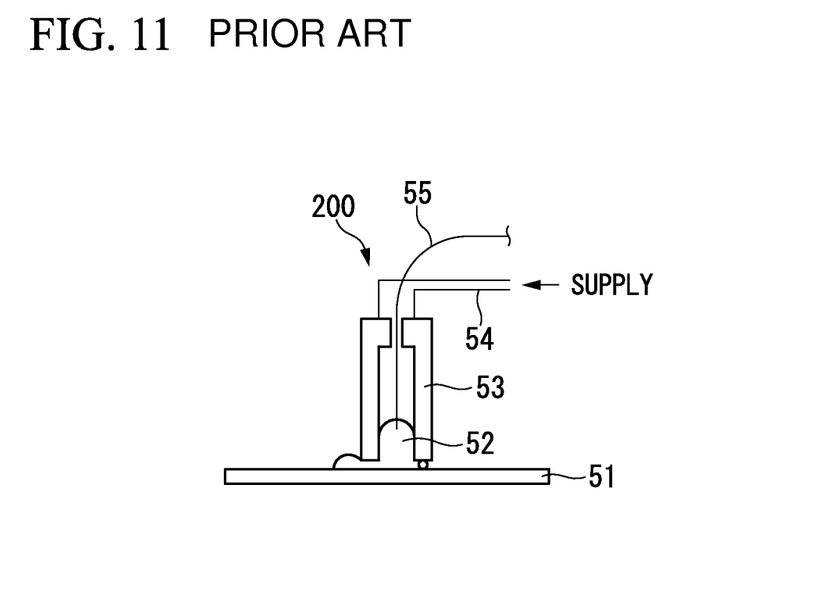
FIG. 11 is a schematic diagram showing a semiconductor wafer evaluation method of the related art.

However, in the semiconductor evaluation device of the related art, in a case where there are foreign matters or protrusions on the surface of the semiconductor wafer, the mercury is leaked out from the gap between a support tool and the semiconductor wafer without the tip end of the support tool of the mercury probe such as the capillary or the like, being in good contact with the surface of the semiconductor wafer (refer to FIGS. 10 and 11). In this case, a contact area (mercury electrode area) between the mercury and the semiconductor wafer has a disadvantage that the electrical characteristics of the semiconductor wafer cannot be accurately calculated since a cross-section area of the capillary becomes as large as the spread area where the mercury is leaked out from the capillary.

In addition, when the semiconductor evaluation device is strongly pressed against the semiconductor wafer in order to decrease variations of a contact area between the mercury and the semiconductor wafer, there is a danger that the semiconductor wafer will be damaged or broken.

Moreover, in the semiconductor evaluation device in the related art, the mercury that is equal to or greater than a mercury amount spread by the contact with the semiconductor wafer is injected into the interior of the capillary.

The present invention is made in view of the above circumstances, and an object of the invention is to provide a semiconductor wafer evaluation method that can accurately measure the electrical characteristics and prevent damages to the semiconductor wafer regardless of the presence or absence of foreign matters or concavo-convex shapes on the surface of the semiconductor wafer and prevent damages to the semiconductor wafer. In addition, another object of the present invention is to provide a semiconductor wafer evaluation device and a probe for a semiconductor evaluation device used in the semiconductor wafer evaluation method.

The present invention provides the following means.

(1) A semiconductor wafer evaluation method of performing an evaluation of electrical characteristics of a semiconductor wafer by bringing mercury into contact with a surface of the semiconductor wafer, the method including using a probe constituted of a fixed electrode having a tip end portion and a transparent covering portion that covers a portion other than the tip end portion of the fixed electrode, the fixed electrode being made of a metal having stronger wettability with respect to the mercury than the semiconductor wafer and the covering portion and measuring the electrical characteristics by attaching the mercury to the tip end portion of the fixed electrode and then by bringing the mercury into contact with the surface of the semiconductor wafer.

Here, "wettability with respect to mercury" in the present specification is a physical quantity indicating ease of familiarity of the mercury, and is obtained by being evaluated using a contact angle formed between the mercury and the surface in which the mercury is in contact with a solid surface. "A metal having stronger wettability with respect to the mercury than the semiconductor wafer and the covering portion" refers to a metal in which the contact angle formed between the mercury and the contact surface when the mercury is in contact with the metal having strong wettability with respect to the mercury has a smaller contact angle than any angles formed between the mercury and the surface in the contact surface when the mercury is in contact with the semiconductor wafer or the covering portion.

In addition, the "tip end portion" of the fixed electrode in the present specification refers to a portion that is not covered with the covering portion that is a portion to which the mercury is not attached on the side in contact with the semiconductor wafer of the fixed electrode.

(2) The semiconductor wafer evaluation method according to the aspect (1), in which the mercury may be attached to the tip end portion of the fixed electrode by immersing the probe in a mercury reservoir.

(3) The semiconductor wafer evaluation method according to any one of the aspects (1) or (2), in which a contact area of the mercury with the semiconductor wafer may be optically measured at the time of measurement of the electrical characteristics.

(4) A semiconductor wafer evaluation device for performing an evaluation of electrical characteristics of a semiconductor wafer by bringing mercury into contact with a surface of a semiconductor wafer, including a probe constituted by a fixed electrode having a tip end portion and a transparent covering portion covering a portion other than the tip end portion of the fixed electrode, in which the fixed electrode is made of a metal having stronger wettability with respect to the mercury than the semiconductor wafer and the covering portion.

(5) The semiconductor wafer evaluation device according to the aspect (4), in which the fixed electrode may be constituted by any one selected from a group consisting of platinum, nickel, iron, cobalt, manganese and an alloy containing one or two or more kinds thereof.

(6) The semiconductor wafer evaluation device according to the aspects (4) or (5), in which the covering portion may be made of any of glass, resin and silicon carbide.

(7) A probe for a semiconductor evaluation device for performing an evaluation of electrical characteristics of a semiconductor wafer by bringing mercury into contact with a surface of a semiconductor wafer, including a fixed electrode having a tip end portion, and a transparent covering portion covering a portion other than the tip end portion of the fixed electrode.

According to the present invention, a small amount of mercury is attached only to the tip end portion of the fixed electrode in the probe. In this state, when pressing the probe against the semiconductor wafer, the mercury is spread on the surface of the semiconductor wafer. In this manner, the mercury electrode is formed on the surface of the semiconductor wafer and electrical characteristics of the semiconductor wafer are measured. Accordingly, the area (mercury electrode area) of the mercury spread on the surface of the semiconductor wafer can be accurately measured via a transparent covering portion.

In addition, when measuring the electrical characteristics of the semiconductor wafer, it is possible to prevent damages of the semiconductor wafer since the semiconductor wafer and the covering portion are not in direct contact.

Further, a fixed electrode is configured of a metal having stronger wettability with respect to the mercury than the semiconductor wafer and the covering portion. For this reason, it is possible to separate the probe from the semiconductor wafer without remaining the mercury either on the surface of the semiconductor wafer or on the covering portion of the probe after the measurement of the electrical characteristics.

DETAILED DESCRIPTION OF THE INVENTION

Hereinafter, preferred examples of a semiconductor wafer evaluation method, a semiconductor wafer evaluation device, and a probe for a semiconductor evaluation device applying the present invention will be described with reference to FIGS. 1 to 6. Moreover, the present invention is not limited to the examples. It is possible to change or increase the number, location, and size or the like of components within the scope of the invention. In addition, figures used in the following description are schematic, and the ratios of length, width, and thickness do not necessarily match the actual ones.

First, a configuration of the semiconductor wafer evaluation device and the probe for a semiconductor evaluation device will be described with reference to FIG. 1.

A semiconductor wafer evaluation device 10 performs an evaluation of the electrical characteristics of a semiconductor wafer 11 by bringing mercury 12 into contact with the surface 11a of the semiconductor wafer 11. The semiconductor wafer evaluation device 10 includes a fixed electrode 13 having a tip end portion 13p and a probe 15 (probe for semiconductor evaluation device) constituted by a transparent covering portion 14 covering a portion 13c other than the tip end portion 13p of the fixed electrode 13.

In addition, the semiconductor evaluation device 10 includes a measurement unit 16, wires 17A and 17B, a stage 18, cables 19A and 19B, a microscope 20, a signal cable 21, and a movement control mechanism 22.

The fixed electrode 13 is constituted by a metal having a stronger wettability with respect to mercury than the semiconductor wafer and the covering portion. As an example of the metal includes an alloy which contains one or two or more kinds selected from the group consisting of platinum, nickel, iron, cobalt, and manganese, and the like. As an example of the alloy includes kovar which is an alloy of iron, nickel, and cobalt, or a stainless alloy which is an alloy of iron and nickel. In the fixed electrode 13, it is preferable to use platinum or kovar having a high and stable wettability with respect to mercury.

It is possible for the fixed electrode 13 to hold the mercury 12 to the probe 15 in a state of being attached to the tip end portion 13p. In FIG. 1, the fixed electrode 13 is illustrated which is in a state where an end surface of the tip end portion 13p forms the same surface as the end surface 14b of the covering portion 14. However, the tip end portion 13p is not limited to such a shape. That is, the tip end portion 13p may be any shape as long as it is possible to project an exposed surface 12d of the mercury 12 on the surface 11a side of the semiconductor wafer 11 from the end surface 14b of the covering portion 14. For example, the tip end portion 13p may have a concave surface or a convex surface with respect to the surface 11a of the semiconductor wafer 11. It is preferable that the tip end portion 13p be circular in plan view so that the mercury 12 is stably held in the tip end portion 13p. That is, it is preferable that the fixed electrode 13 be cylindrical or conical. The amount (volume) of the mercury 12 attached to the tip end portion 13p is dependent on the surface area of the tip end portion 13p. For example, in a case of locally obtaining the electrical characteristics of the semiconductor wafer, the area of the tip end portion 13p in a plan view can be as small as possible in a range where there is no interference in the measurement of the electrical characteristics. For example, it is preferable that the diameter of the tip end portion 13p in plan view be approximately 0.5 mm. In this manner, in the semiconductor wafer evaluation device 10 of the present embodiments, measurement can be performed by attaching only a small amount (such as $3.3 \times 10^{-8}$ L) of the mercury to the tip end portion 13p of the fixed electrode 13. For this reason, in the semiconductor wafer evaluation device 10 of the present embodiment, the amount of mercury used can be minimized.

Further, the fixed electrode 13 is connected to the measurement unit 16 via the wire 1713. For this reason, when the mercury 12 is in contact with the surface 11a of semiconductor wafer 11, response of the semiconductor wafer 11 by the electrical signal generated from the measurement unit 16 is transmitted to the measurement unit 16 from the wire 17B.

The covering portion 14 is a transparent member covering the portion 13c other than the tip end portion 13p of the fixed electrode 13. Materials of the covering portion 14 are not limited as long as the materials are transparent, do not react to mercury, and do not have ease of familiarity of the mercury. Such materials, for example, are glass, resin, and silicon carbide. In the covering portion 14, it is preferable to use glass in which transparency is high, wettability with respect to the mercury 12 is extremely low without reacting to the mercury 12, and workability is excellent, and it is more preferable to use quartz in which transparency is extremely high.

Figure 1:
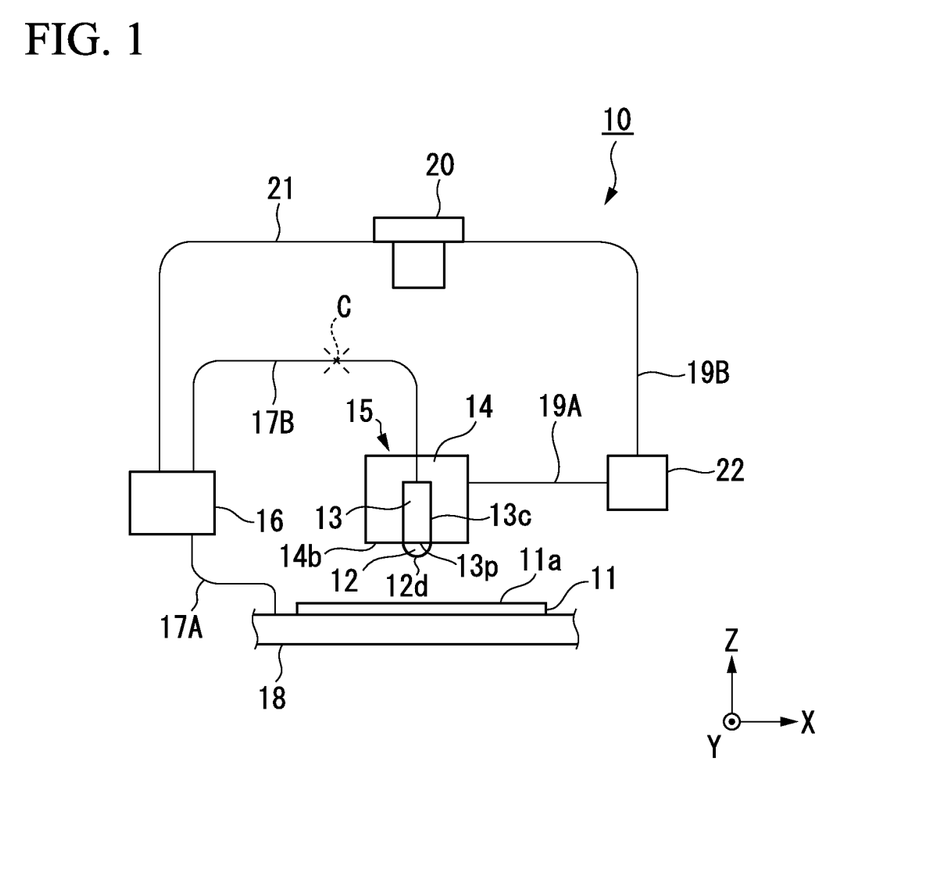
FIG. 1 is a schematic diagram illustrating a configuration of a semiconductor wafer evaluation device of the present invention.

In FIG. 1, the covering portion 14 is illustrated which is in a state where the end surface 14b forms the same surface as the end surface of the tip end portion 13p of the fixed electrode 13. However, the covering portion 14 is not limited to such a shape.

That is, the covering portion 14 may be any shape as long as it is possible to project an exposed surface 12d of the mercury 12 toward the surface 11a side of the semiconductor wafer 11. For example, the end surface 14b of the covering portion 14 may be inclined so as to be high enough (in Z direction in FIG. 1) to be separated from the fixed electrode 13.

Moreover, the covering portion 14 is installed in a support tool (not shown). The support tool is connected to a movement control mechanism 22 via the cable 19A. The movement control mechanism 22 controls the location, the movement direction, and the moving distance of the fixed electrode 13 in each direction of X direction, Y direction, and Z direction.

The probe 15 is constituted by the fixed electrode 13 having the tip end portion 13p and the transparent covering portion 14 covering the portion 13c other than the tip end portion 13p of the fixed electrode 13. Moreover, the probe 15 may be fixed to the semiconductor wafer evaluation device 10, and may also be installed in a removable state. In a case where the probe 15 is removable, a connecting point C is provided in the middle of the wire 17B, and a portion of the wire 17B connected to the probe 15 and the fixed electrode 13 may be removable and mountable.

The measurement unit 16 transmits an electrical signal to a stage 18 via the wire 17A and captures the response of the fixed electrode 13 with respect to the electrical signal via the wire 17B. The measurement unit 16 calculates carrier density of the semiconductor wafer 11 from the response with respect to the electrical signal.

Moreover, the semiconductor wafer evaluation device 10 of the present embodiments includes a C-V measurement unit 16 as an example of the electrical characteristic measurement unit that measures the electrical characteristics may include another electrical characteristic measurement unit. The semiconductor wafer evaluation device 10 of the present embodiment can measure the electrical characteristics other than the C-V characteristics.

The microscope 20 is installed above the probe 15. The microscope 20 can accurately and optically measure a mercury electrode area S of the semiconductor wafer 11 of the mercury 12, when performing measurement of the mercury electrode area S in the evaluation of the semiconductor wafer. The mercury electrode area S is estimated from volume, load, and surface tension of the mercury 12. However, in the C-V measurement of the semiconductor wafer 11, an accurate mercury electrode area S is required. For this reason, when performing an optical measurement of the mercury electrode area S, it is preferable to use a microscope. Load is dependent on the weight of the probe 15.

When performing optical measurement of the mercury electrode area S, light is emitted from a light source provided in the microscope 20 when the mercury 12 is in contact with the surface 11a of the semiconductor wafer 11. A wavelength of the light is the wavelength such as a wavelength of visible light that passes through the covering portion 14, but does not pass through the mercury 12. When performing imaging using an imaging device provided in the microscope 20, an image in which only a presence region of the mercury 12 is displayed in black can be obtained. Moreover, since a depth of field of the microscope 20 is shallow, the images of the fixed electrode 13, the covering portion 14, and the wire 17B are not captured. When converting a black region of the obtained image to actual size, the mercury electrode area S of the semiconductor wafer 11 of the mercury 12 is measured. The measured mercury electrode area S may be input to the measurement unit 16 by a user of the semiconductor wafer evaluation device 10, as illustrated in FIG. 1, and may also be automatically transmitted to the measurement unit 16 by connecting the microscope 20 and the measurement unit 16 using the signal cable 21.

In a case where the probe 15 performs the measurement of the electrical characteristics in succession while moving the surface 11a of the semiconductor wafer 11, a moving mechanism (not shown) is provided in the microscope 20. By this, the microscope 20 is moved according to the movement of the probe 15. In such a case, as illustrated in FIG. 1, the microscope 20 is connected to the movement control mechanism 22 using the cable 19B. In the configuration illustrated in FIG. 1, the position, the moving direction, and the moving distance which are in each of the X direction, the Y direction, and the Z direction of the fixed electrode 13 and the microscope 20 are synchronized and controlled by the movement control mechanism 22. Instead of the probe 15, the stage 18 may be movable.

The movement control mechanism 22 is connected to the probe 15 via the cable 19A, and connected to the microscope 20 via the cable 19B. As a result, the movement control mechanism 22 transmits the position, moving direction, and moving distance of the probe 15 to the support tool of the probe 15 (not shown), and transmits the same position, moving direction, and moving distance as the probe 15 to the movement mechanism of the microscope 20.

The semiconductor wafer 11 is an evaluation object of the semiconductor wafer evaluation device 10, even though the type is not particularly limited, and, for example, is a wafer which does not have ease of familiarity of the mercury. Examples of such wafers include a SiC wafer, a silicon wafer, and the like. In addition, the semiconductor wafer 11 may be an epitaxial wafer obtained by forming an epitaxial layer through epitaxial growth on the surface of the silicon wafer, the SiC wafer, and a GaN wafer.

The semiconductor wafer 11 is placed on the stage 18 made of a material having conductivity. The stage 18 is connected to the measurement unit 16 via the wire 17A. For this reason, the electrical signal emitted from the measurement unit 16 is transmitted to the semiconductor wafer 11.

The mercury 12 is held by the probe 15 by being attached to the tip end portion 13p of the fixed electrode 13. When mounting the probe 15, the exposed surface 12d of the mercury 12 projects toward the surface 11a of the semiconductor wafer 11 from the end surface 14b of the covering portion 14.

Next, the semiconductor wafer evaluation method using the semiconductor wafer evaluation device 10 and the probe 15 for a semiconductor evaluation device of the present embodiments will be described with reference to FIGS. 2 to 6.

Figure 2:
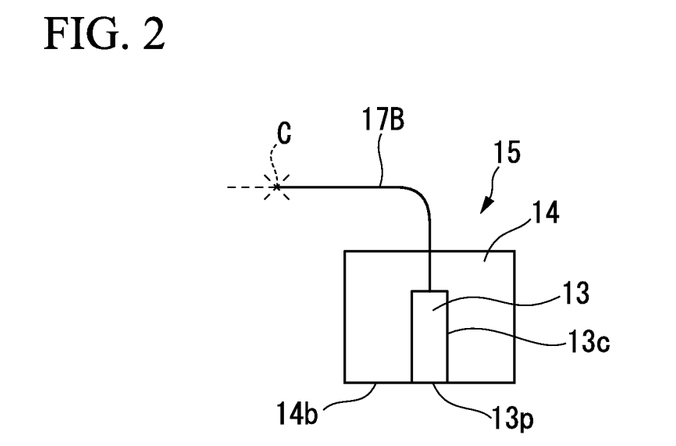
FIG. 2 is a schematic diagram showing a semiconductor wafer evaluation method of the present invention.

As illustrated in FIG. 2, in an initial state of the evaluation of the semiconductor wafer 11, the mercury 12 is not attached to the tip end portion 13p of the fixed electrode 13. However, after the first measurement of the measurement position of one sheet or a plurality of sheets of the semiconductor wafer 11, without removing the mercury 12 from the tip end portion 13p of the fixed electrode 13, there is a case of subsequently performing the measurement of the electrical characteristics more than once using the same mercury 12. In such a case, a process of mercury fractionation to be described next will be omitted.

In addition, it is preferable to perform the evaluation of the semiconductor wafer 11 at room temperature in order to maintain moderate viscosity of the mercury 12.

Figure 3:
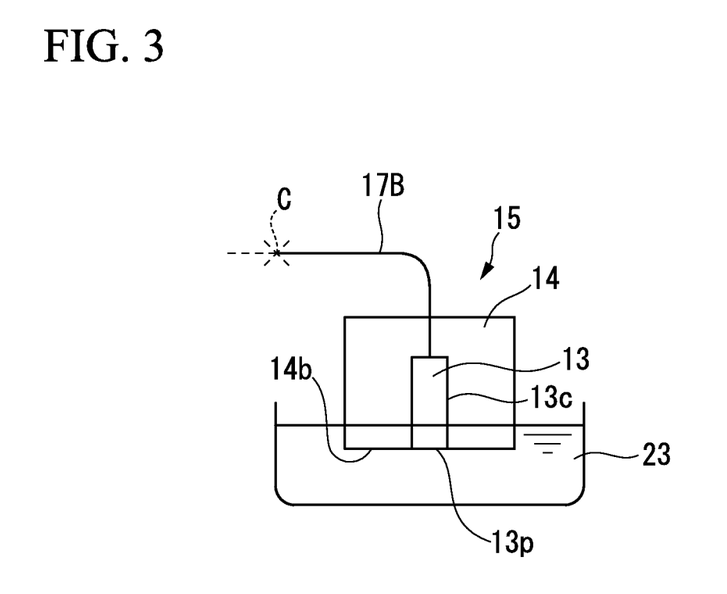
FIG. 3 is a schematic diagram showing the semiconductor wafer evaluation method of the present invention.

First, as illustrated in FIG. 3, the probe 15 is positioned above a mercury reservoir 23 and then immersed in the mercury reservoir 23. In a case of the configuration in which the probe 15 is fixed to the semiconductor wafer evaluation device 10, the mercury reservoir 23 is moved. On the other hand, in a case where the probe 15 is installed removably from the semiconductor wafer evaluation device 10 at a connecting point C illustrated in FIG. 1, the probe 15 is removed from the semiconductor wafer evaluation device 10, is moved, and then is immersed in the mercury reservoir 23. Then, the probe 15 is quietly lifted, or the mercury reservoir 23 is lowered.

Figure 4:
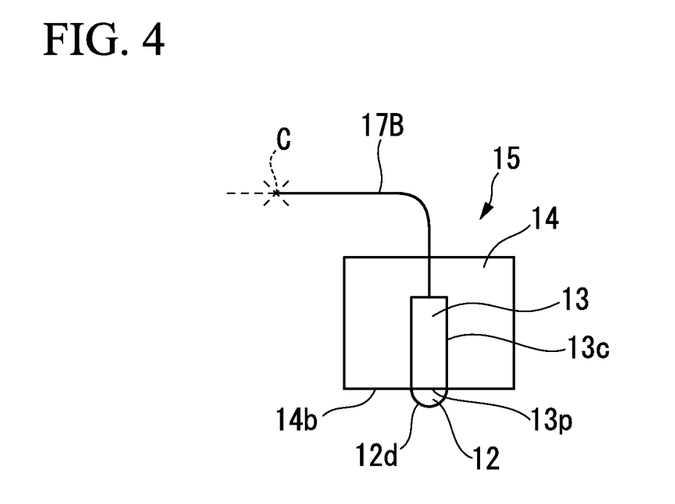
FIG. 4 is a schematic diagram showing the semiconductor wafer evaluation method of the present invention.

Since the fixed electrode 13 is a metal having a good wettability with mercury, if the probe 15 is separated from the mercury reservoir 23, as illustrated in FIG. 4, a small amount of the mercury 12 is attached to the tip end portion 13p of the fixed electrode 13. In a case where the probe 15 is removable from the semiconductor wafer evaluation device 10, the probe 15 is mounted on the semiconductor wafer evaluation device 10. Moreover, in FIGS. 4 to 6, the configuration elements other than the semiconductor wafer 11, the probe 15, the wire 17B, the stage 18, and the microscope 20, of the semiconductor wafer evaluation device 10 are not illustrated.

As described above, when attaching a small amount of the mercury 12 to the tip end portion 13p of the fixed electrode 13, it is possible to reduce the amount of mercury used.

Figure 5:
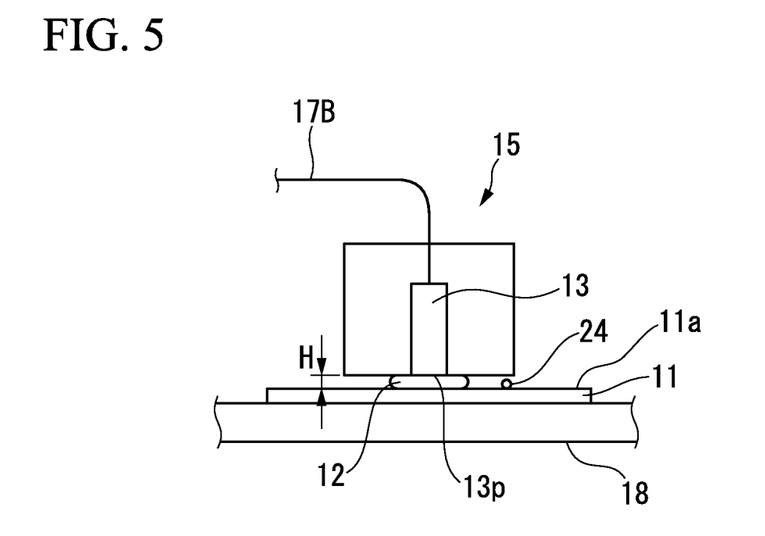
FIG. 5 is a schematic diagram showing the semiconductor wafer evaluation method of the present invention.

Next, the probe 15 to which the mercury 12 is attached is lowered toward the surface 11a of the semiconductor wafer 11 placed on the stage 18 in advance. As illustrated in FIG. 5, a bottom surface of the probe 15 and the surface 11a of the semiconductor wafer 11 are opposed at a certain interval H and the mercury 12 is spread out by the surface tension and the load. In the configuration illustrated in FIG. 1, the bottom surface of the probe 15 means the tip end portion 13p and the end surface 14b. The mercury 12 spreads in a substantially circular shape in a plan view. The mercury electrode area S is approximately determined by the attachment amount of mercury, the surface tension of the mercury, the load applied to the mercury, and the interval H. In a case where the probe 15 is not held by the support tool or the like, the load applied to the mercury is equal to the weight of the probe 15. In a case where the probe 15 is held by the support tool or the like, the load applied to the mercury is dependent on the interval H.

For example, in a case of setting the interval H to 0.01 mm by attaching $3.3 \times 10^{-8}$ L mercury 12 to the tip end portion 13p of the fixed electrode 13, the mercury electrode area S is 3.27 mm$^2$.

According to the above-described the lowering of the probe, the mercury 12 is attached to the tip end portion 13p of the fixed electrode 13 in advance, and only the mercury 12 is brought in contact with the surface 11a of the semiconductor wafer 11, and thus the electrical characteristics are measured. For this reason, it is not necessary to bring the probe 15 into contact with the surface 11a of the semiconductor wafer 11. Accordingly, there is no disadvantage of either damaging or breaking the probe 15 and the semiconductor wafer 11. In addition, even if there is a foreign matter 24 (refer to FIG. 5) or a concavo-convex shape on the surface 11a of the semiconductor wafer 11 directly under the covering portion 14, if the interval H is sufficiently ensured, the mercury electrode area S does not change from a case where there is no foreign matter 24 or concavo-convex shape on the surface 11a of the semiconductor wafer 11 directly under the covering portion 14.

Figure 6:
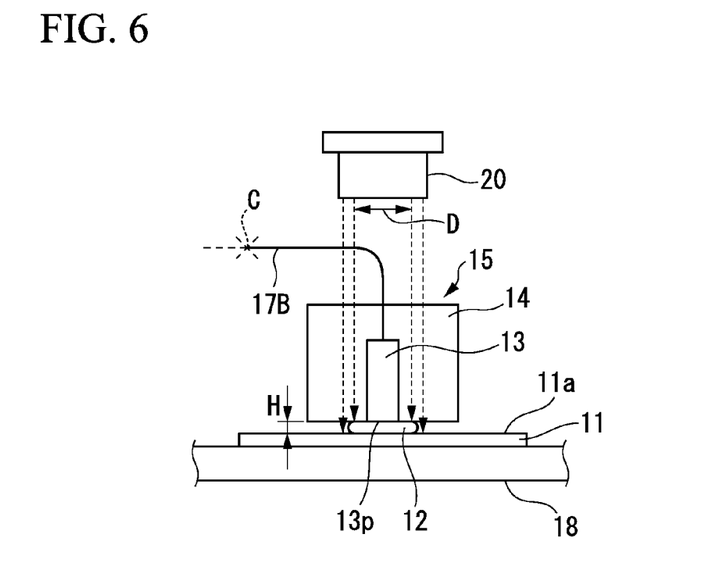
FIG. 6 is a schematic diagram showing the semiconductor wafer evaluation method of the present invention.

Next, the microscope 20 is moved above the probe 15 by the movement control mechanism 22. Subsequently, as illustrated in FIG. 6, light is radiated to the mercury 12 spread by pushing to a surrounding area thereof, and thus an image is captured using the imaging device of the microscope 20. A diameter D and the mercury electrode area S of the mercury 12 are measured from the image obtained. The mercury electrode area S is transmitted to the measurement unit 16 via the signal cable 21.

A state where the semiconductor wafer 11 and the probe 15 are opposed at the interval H is maintained, and the electrical signal is transmitted from the measurement unit 16 to the semiconductor wafer 11 via the wire 17A. At the same time, the response of the fixed electrode 13 with respect to the electrical signal is retrieved via the wire 17B. In the measurement unit 16, the electrical characteristics of the semiconductor wafer 11 such as carrier density or the like are calculated by the electrical signal, the response of the fixed electrode 13, the mercury electrode area S, and the electrical characteristics or the like of the conductivity or the like of the pre-stored mercury 12.

According to the above-described procedure, the electrical characteristics of the semiconductor wafer 11 can be obtained.

After the end of the measurement of the electrical characteristics of the semiconductor wafer 11, the mercury 12 may be removed from the fixed electrode 13. However, in many cases, measurement of the electrical characteristics of the semiconductor wafer 11, is performed in different positions (such as ten positions) on same sheet. That is, the measurement of the electrical characteristics of the semiconductor wafer 11 is frequently performed at the plurality of the measurement points. In this case, it is possible to perform the measurement of the electrical characteristics in a plurality of measurement points in the semiconductor wafer 11 by using the same mercury 12 without removing the mercury 12 from the fixed electrode 13. As the timing of the replacement of the mercury 12, for example, (1) the range of the area of the mercury spread by pushing is defined from the image captured by the microscope 20, and the mercury is exchanged when the mercury electrode area S is apart from the range of the area, (2) the mercury is exchanged when the semiconductor wafer 11 is replaced, (3) a number of measurements (number of times that the mercury 12 contacts the semiconductor wafer 11) are defined, and the mercury is exchanged when it reaches the number of contacts, or the like. However, the timing of replacement of the mercury 12 is not particularly limited.

In addition, as long as the response from the fixed electrode 13 with respect to the electrical signal transmitted to the semiconductor wafer 11 is obtained, and as a result, the measurement of the electrical characteristics can be accurately made, the frequency of removal and fractionation of the mercury 12 is not limited.

As described above, in the evaluation method of the semiconductor wafer of the present embodiments, only a small amount of the mercury 12 is attached to the tip end portion 13p of the fixed electrode 13 in the probe 15, and the probe 15 is pressed against the semiconductor wafer 11, and thus the mercury 12 is spread on the surface 11a of the semiconductor wafer 11. Then, a mercury electrode is formed on the surface 11a of the semiconductor wafer 11, and the electrical characteristics of the semiconductor wafer 11 are measured. Accordingly, the mercury electrode area S of the mercury 12 spread to the surface 11a of the semiconductor wafer 11 is accurately measured via the transparent covering portion 14. In addition, at this time, the semiconductor wafer 11 and the covering portion 14 are not in direct contact, the semiconductor wafer 11 is not damaged. Further, the fixed electrode 13 is a metal having stronger wettability with respect to the mercury 12 than the semiconductor wafer 11 and the covering portion 14. For this reason, after the measurement of the electrical characteristics, the probe 15 is separated from the semiconductor wafer 11 without the mercury remaining on the surface 11a of the semiconductor wafer 11 and the covering portion 14 of the probe 15.

In this manner, the present invention is able to provide an evaluation method of a semiconductor wafer that can prevent damage to the semiconductor wafer as well as to enable the accurate measurement of the electrical characteristics, regardless of the presence or absence of foreign matter or concavo-convex shapes on the surface of the semiconductor wafer. In addition, the present invention is able to provide a semiconductor wafer evaluation device and a probe for a semiconductor evaluation device used in the evaluation method of the semiconductor wafer.

While preferred embodiments of the invention have been described and illustrated above, it should be understood that these are exemplary examples of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A semiconductor wafer evaluation method of performing an evaluation of electrical characteristics of a semiconductor wafer by bringing mercury into contact with a surface of the semiconductor wafer, the method comprising:

using a probe constituted of a fixed electrode having a tip end portion and a transparent covering portion that covers a portion other than the tip end portion of the fixed electrode, the fixed electrode being made of a metal having stronger wettability with respect to the mercury than the semiconductor wafer and the covering portion; and measuring the electrical characteristics by attaching the mercury to the tip end portion of the fixed electrode and then bringing only the mercury into contact with the surface of the semiconductor wafer, wherein the fixed electrode is solid.

2. The semiconductor wafer evaluation method according to claim 1,
wherein the mercury is attached to the tip end portion of the fixed electrode by immersing the probe in a mercury reservoir.

3. The semiconductor wafer evaluation method according to claim 1,
wherein a contact area of the mercury with the semiconductor wafer is optically measured at the time of measurement of the electrical characteristics.

4. A semiconductor wafer evaluation device for performing an evaluation of electrical characteristics of a semiconductor wafer by bringing mercury into contact with a surface of the semiconductor wafer, the device comprising;
a probe constituted by a fixed electrode having a tip end portion and a transparent covering portion that covers a portion other than the tip end portion of the fixed electrode,
wherein the fixed electrode is made of metal having stronger wettability with respect to the mercury than the semiconductor wafer and the covering portion,
wherein the fixed electrode is solid.

5. The semiconductor wafer evaluation device according to claim 4,
wherein the fixed electrode is constituted by any one selected from a group consisting of platinum, nickel, iron, cobalt, manganese and an alloy containing one kind or two or more kinds thereof.

6. The semiconductor wafer evaluation device according to claim 4,
wherein the covering portion is made of any of glass, resin and silicon carbide.

7. A probe for a semiconductor evaluation device for performing an evaluation of electrical characteristics of a semiconductor wafer by bringing mercury into contact with a surface of the semiconductor wafer, the probe comprising:
a fixed electrode having a tip end portion; and
a transparent covering portion that covers a portion other than the tip end portion of the fixed electrode,
wherein the fixed electrode is solid.

8. The semiconductor wafer evaluation method according to claim 1,
wherein on measuring the electrical characteristics, the probe is pressed to the semiconductor wafer to spread the mercury on the surface of the semiconductor wafer so that a contact area between the mercury and the semiconductor wafer becomes larger than the area of the fixed electrode in plan view.

9. The semiconductor wafer evaluation device according to claim 4, further comprising an optical microscope.

10. The semiconductor wafer evaluation device according to claim 4, wherein the fixed electrode a cylindrical solid.

11. The semiconductor wafer evaluation method according to claim 2, wherein the mercury is maintained on the tip of the fixed electrode without creating a vacuum inside the fixed electrode.

12. A probe for a semiconductor evaluation device according to claim 7, wherein the fixed electrode is a cylindrical solid.

* * * * *